US005471167A

United States Patent [19]

L'Hermite et al.

[11] Patent Number: 5,471,167
[45] Date of Patent: Nov. 28, 1995

[54] CIRCUIT FOR USE WITH A FEEDBACK ARRANGEMENT

[75] Inventors: François L'Hermite, Lasserre; Joel Turchi, Toulouse, both of France

[73] Assignee: Motorola, Inc., Schaumburg, Ill.

[21] Appl. No.: 285,466

[22] Filed: Aug. 3, 1994

[30] Foreign Application Priority Data

Aug. 13, 1993 [FR] France .................................. 93 09980

[51] Int. Cl.$^{6}$ .............................. H02J 1/00; H03K 5/153

[52] U.S. Cl. ............................ 327/538; 327/73; 327/545

[58] Field of Search ................................ 327/58, 62, 73, 327/72, 74, 76, 538, 540, 543, 545, 546

[56] References Cited

U.S. PATENT DOCUMENTS

| | | | |
|---|---|---|---|
| 3,602,804 | 8/1971 | Randall . | |
| 3,668,532 | 6/1972 | Potash | 327/62 |
| 3,989,958 | 11/1976 | Renirie et al. | 327/74 |
| 4,263,520 | 4/1981 | Kajihata et al. | 327/72 |
| 4,313,083 | 1/1982 | Gilbert et al. | 327/535 |
| 4,317,054 | 2/1982 | Caruso et al. | 327/539 |
| 4,438,346 | 3/1984 | Chuang et al. | 327/541 |
| 4,613,770 | 9/1986 | Raab | 327/74 |
| 5,339,272 | 8/1994 | Tedrow et al. | 327/540 |

FOREIGN PATENT DOCUMENTS

| | | | |
|---|---|---|---|
| 0414319 | 2/1991 | European Pat. Off. . | |
| 0447637 | 9/1991 | European Pat. Off. . | |
| 55-71319 | 5/1980 | Japan | 327/73 |
| 56-115023 | 9/1981 | Japan | 327/62 |
| 62-77715 | 4/1987 | Japan | 327/72 |
| 4-346070 | 12/1992 | Japan | 327/62 |
| 1550611A | 3/1990 | U.S.S.R. | 327/60 |

*Primary Examiner*—Terry Cunningham
*Attorney, Agent, or Firm*—Robert D. Atkins

[57] ABSTRACT

A feedback circuit (10) for use with a feedback arrangement includes an input terminal (12) for receiving a feedback signal from an output of the feedback arrangement. An output terminal (14) is coupled to a regulating arrangement of the feedback arrangement. A sampling arrangement (16) is coupled to the input terminal for providing a delayed feedback signal. A further arrangement (18,20,22,24,26,28) is coupled to the output terminal (14) for comparing the feedback signal with the delayed feedback signal and with a predetermined reference signal, such that the further arrangement (18,20,22,24,26,28) disables the regulating arrangement if a certain relationship exists between the compared signals.

5 Claims, 2 Drawing Sheets

CIRCUIT FOR USE WITH A FEEDBACK ARRANGEMENT

FIELD OF THE INVENTION

This invention relates to circuits for use with feedback arrangements.

BACKGROUND OF THE INVENTION

In a typical feedback arrangement, a regulator uses an error signal derived from a feedback loop to control an output of the arrangement by sending a control signal to control a source generating the output.

There is typically a time constant associated with the feedback arrangement, a delay occurring between the adjustment of the control signal and an associated change in the output. Thus a transient response may be generated.

A problem with this arrangement is that whilst achieving good regulation, the transient response of the control signal may cause the output to repeatedly overshoot and undershoot the desired level.

Furthermore, a transient control signal may generate a very sharp output change, producing instabilities in the arrangement.

This invention seeks to provide a feedback arrangement in which the above mentioned disadvantages are mitigated.

SUMMARY OF THE INVENTION

According to the present invention there is provided a feedback circuit for use with a feedback arrangement, the arrangement having a feedback signal and regulating means, the circuit comprising an input terminal for receiving the feedback signal from the feedback arrangement; an output terminal coupled to the regulating means of the feedback arrangement; sampling means coupled to the input terminal for providing a delayed feedback signal; disabling means coupled to receive a predetermined reference signal and further coupled to the output terminal for comparing the feedback signal with the delayed feedback signal and with the predetermined reference signal and for disabling the regulating means if a predetermined relationship exists between the compared signals.

According to the present invention there is also provided a feedback arrangement comprising; a variable voltage source coupled to an output terminal for providing a variable voltage thereto; a voltage regulator for providing a regulation control signal to the variable voltage source; a feedback path coupled between the output terminal and the voltage regulator for providing a feedback signal to the voltage regulator; a feedback circuit comprising; an input terminal for receiving the feedback signal from the feedback arrangement; an output terminal coupled to the voltage regulator of the feedback arrangement; sampling means coupled to the input terminal for providing a delayed feedback signal; disabling means coupled to receive a predetermined reference signal and further coupled to the output terminal for comparing the feedback signal with the delayed feedback signal and with the predetermined reference signal and for disabling the regulating means if a predetermined relationship exists between the compared signals.

The disabling means preferably further comprises first and second comparative means; the first comparative means for comparing the feedback signal with the delayed feedback signal and for providing a first control signal; and, the second comparative means for comparing the feedback signal with the predetermined reference signal and for providing a second control signal.

The disabling means preferably further comprises logic means coupled to receive the first and second control signals for determining whether the predetermined relationship exists between the compared signals.

The logic means is preferably arranged to disable further regulation of the feedback arrangement via the output terminal if the first and second control signals indicate that the predetermined relationship exists.

Preferably the predetermined relationship is that an instantaneous trend of the feedback signal will cause the feedback signal to substantially equal the predetermined reference signal.

In this way, good regulation of the output may be achieved, preventing repeated overshoot and undershoot of the desired output level and reducing instabilities in the arrangement.

BRIEF DESCRIPTION OF THE DRAWINGS

An exemplary embodiment of the invention will now be described with reference to the drawings in which.

DETAILED DESCRIPTION OF A PREFERRED EMBODIMENT

Figure 1:
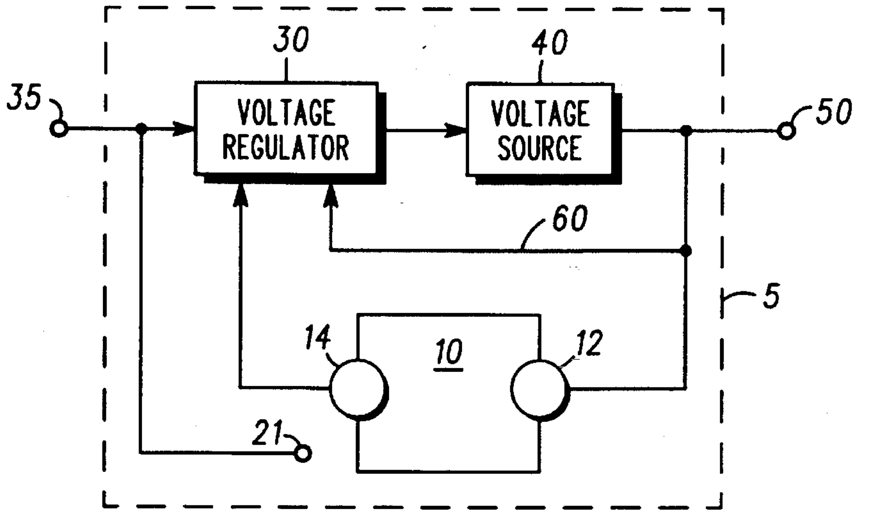
FIG. 1 shows in block diagram form a feedback arrangement incorporating the invention.

Referring to FIG. 1, there is shown a feedback arrangement 5 comprising a voltage regulator 30, coupled to receive a predetermined reference voltage from a reference voltage terminal 35. A voltage source 40 is coupled to receive a control signal from the voltage regulator 30 for providing a regulated voltage to an output terminal 50. A first feedback path 60 is coupled to the output terminal 50 for providing a fed back output voltage to the voltage regulator 30. A circuit 10 is also coupled to the output terminal 50 for providing a control signal to the voltage regulator 30.

Figure 2:
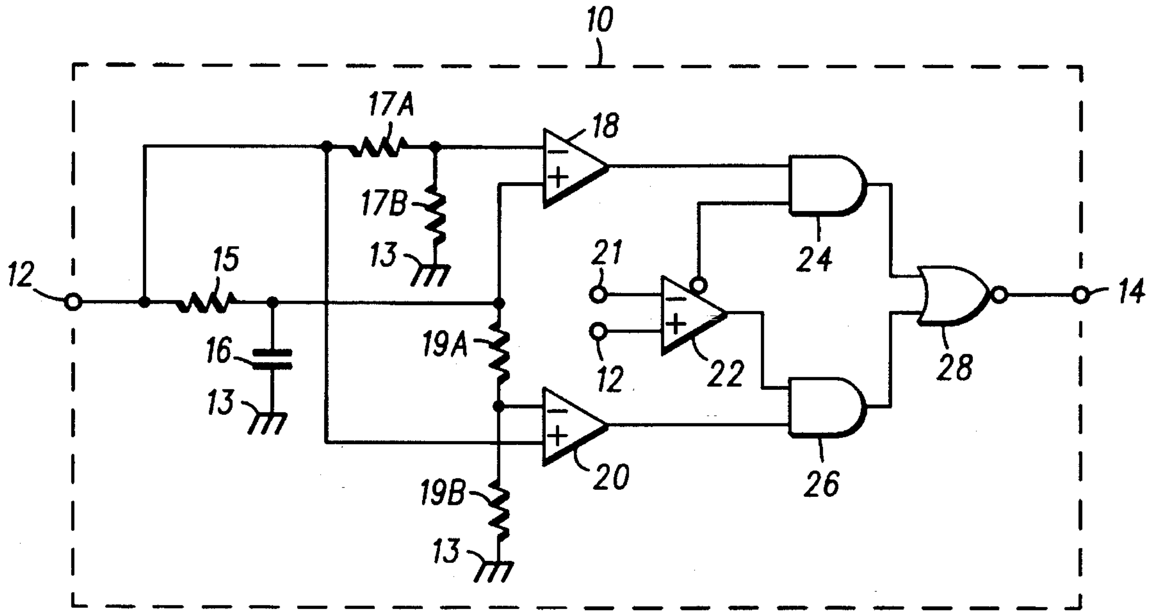
FIG. 2 shows a preferred embodiment of a circuit for use with the feedback arrangement of FIG. 1.

Referring now also to FIG. 2, an input terminal 12 of the circuit 10 provides a coupling to the output voltage terminal 50 of the feedback arrangement 5. An output terminal 14 of the circuit 10 provides coupling to the voltage regulator 30. In this way the circuit 10 provides a second feedback path via the input terminal 12 and the output terminal 14 to the voltage regulator 30.

Within the circuit 10 a storage capacitor 16 is coupled between the input terminal 12 and a ground node 13. A resistor 15 is connected between the input terminal 12 and the capacitor 16. Thus the resistor 15 and capacitor 16 form an integrating arrangement. A first comparator 18 has an inverting input coupled to the input terminal 12 and a non-inverting input coupled to the integrating arrangement of resistor 15 and capacitor 16, and an output for providing a first control signal.

A first potential divider circuit composed of resistors **17*a* and 17*b* is coupled between the input terminal 12 and the ground node 13. The inverting input of the first comparator 18 is connected to a point between the resistors 17*a* and 17*b*** such that the inverting input receives a divided voltage.

In a similar way a second comparator 20 has an inverting input coupled to the integrating arrangement of resistor 15 and capacitor 16, a non-inverting input coupled to the input terminal 12 and an output for providing a second control signal thereat.

A second potential divider circuit composed of resistors 19*a* and 19*b* is coupled between the integrating arrangement 15,16 and the ground node 13. The inverting input of the second comparator 20 is connected to a point between the resistors 19*a* and 19*b* such that the inverting input receives a divided voltage.

The resistors 17*a*, 17*b* and 19*a*, 19*b* are arranged such that the potential divider circuits provide 99% of their received voltage to the comparators.

A third comparator 22 has a non-inverting input coupled directly to the input terminal 12 and an inverting input connected to a terminal 21. The terminal 21 is coupled to receive the predetermined reference voltage from the reference voltage terminal 35. The third comparator 22 has a normal output and a negated output.

A first AND gate 24 is coupled to receive the output from the first comparator 18 and the negated output from the third comparator 22 for providing a first logic signal. Similarly, a second AND gate 26 is coupled to receive the second control signal from the second comparator 20 and the normal output from the third comparator 22 for providing a second logic signal.

A NOR gate 28 is coupled to receive the first logic signal from the first AND gate 24 and the second logic signal from the second AND gate 26 for providing an output signal to the output terminal 14.

In operation, and with reference to a prior art feedback arrangement not incorporating the circuit 10, the variable voltage source 40 generates a voltage signal to the output terminal 50 of the feedback arrangement 5. The voltage regulator 30 regulates the voltage source 40 in response to the feedback signal through the feedback path 60.

Figure 3:
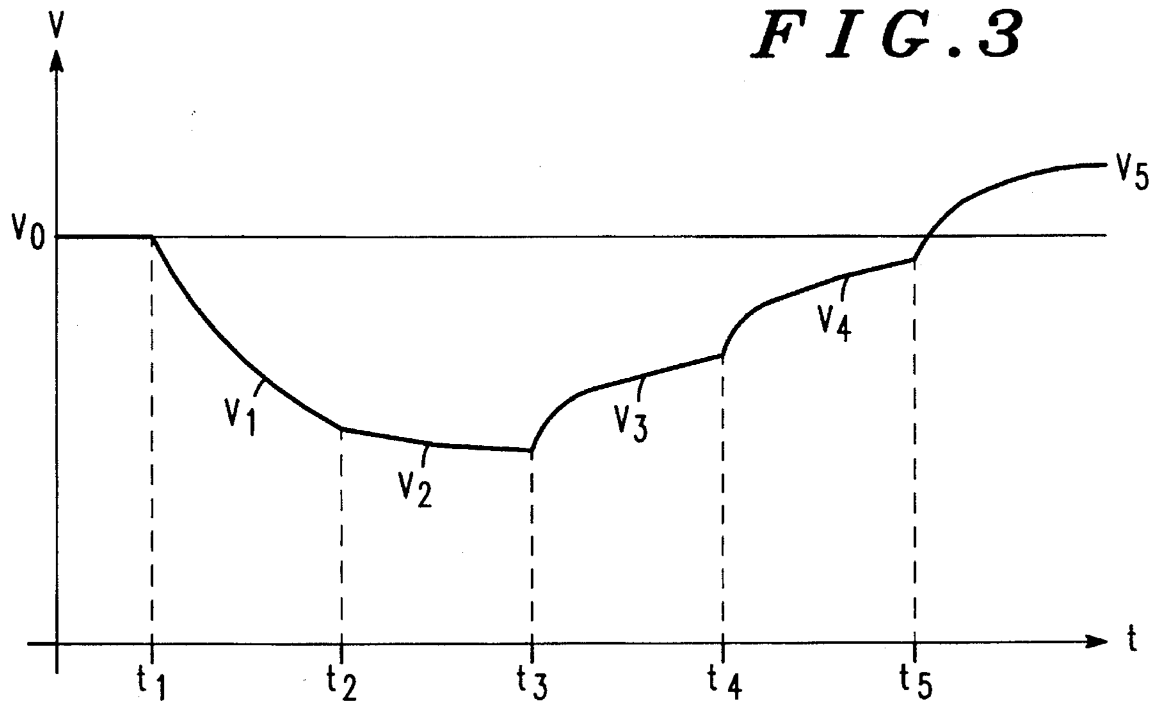
FIG. 3 shows a graph of a typical response of a prior art feedback arrangement; and, FIG. 4 shows a graph of a typical response of the feedback arrangement of FIG. 1.

Referring now also to FIG. 3, a prior art feedback arrangement response is shown based on the feedback arrangement 5 without the circuit 10.

A large output voltage drop, which may for example be caused by a load being connected to the output terminal, occurs at time $t_1$. At regulation points $t_2$–$t_5$ new voltage characteristics $V_2$–$V_5$ respectively are produced by the arrangement 5 to successively regulate the output voltage and bring it back to the desired level $V_0$.

As can be seen in FIG. 3, voltage characteristics $V_4$ and $V_5$ at times $t_4$ and $t_5$ give rise to the output voltage exceeding the desired level $V_0$ (overshoot).

Figure 4:
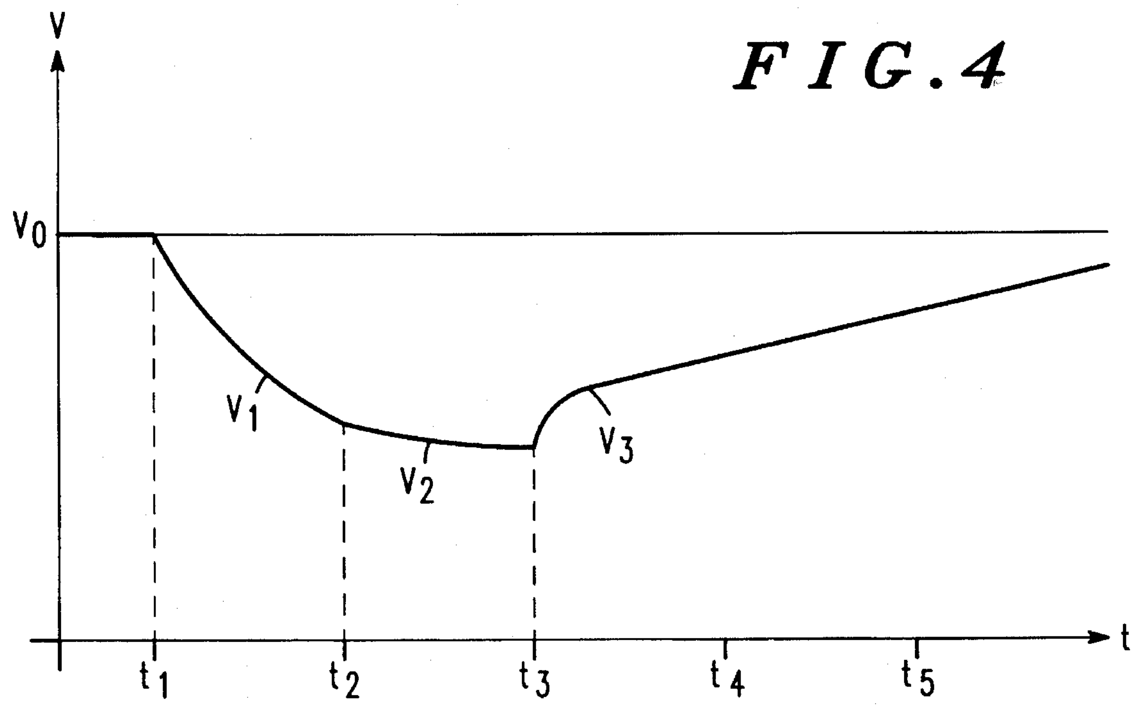

Referring now also to FIG. 4, as will be explained below, with the feedback arrangement 5 now including the circuit 10, the response of the feedback arrangement is significantly improved.

Considering now the functioning of the feedback arrangement including the circuit 10 in more detail, (in comparison with the functioning of the feedback arrangement with only the feedback path 60 as described above) when substantially the same voltage drop occurs at the time $t_1$, the same response is made by the voltage regulator 30.

Within the circuit 10 the feedback signal is received at the input terminal 12 thereby charging up the capacitor 16 through the resistor 15 to the level of the feedback signal. In this way the integrator arrangement 15, 16 stores a slightly delayed value of the feedback signal.

As previously mentioned the potential divider circuit of resistors 17*a* and 17*b* is arranged to provide 99% of the feedback signal to the inverting input of the first comparator 18 and the potential divider circuit of resistors 19*a* and 19*b* is arranged to provide 99% of the signal value stored in the integrator arrangement 15, 16 to the inverting input of the second comparator 20.

Thus the first comparator 18 compares 99% of the present feedback signal with a slightly delayed feedback signal from the capacitor 16, the resulting output being zero if the delayed feedback signal is less than 99% of the feedback signal and positive if the reverse is true.

Similarly, the second comparator 20 compares 99% of the slightly delayed feedback signal from the capacitor 16 with the present feedback signal, the resulting output being zero if the feedback signal is less than 99% of the delayed feedback signal and positive if the reverse is true.

Thus the output from the first comparator 18 is zero if the feedback signal is increasing by more than 1%, and the output from the second comparator 20 is zero if the feedback signal is decreasing by more than 1%.

The third comparator 22 compares the feedback signal from the terminal 12 with the predetermined reference signal from the terminal 21 such that if the feedback signal is less than the reference signal (undershoot case) a zero state occurs at the normal output to the AND gate 26 and a positive state occurs at the negated output to the AND gate 24. Conversely, if the reference signal is lower than the feedback signal (overshoot case) then the opposite occurs, the negated output to the AND gate 24 is zero and the normal output to the AND gate 26 is positive.

In this way the AND gate 24 will have a positive output if and only if the feedback signal is diminishing (positive result from the comparator 18) and the feedback signal (12) is undershooting the predetermined reference voltage (21)(positive negated output from the comparator 22). Otherwise the output of the AND gate 24 will be zero.

Similarly the AND gate 26 will have a positive output if and only if the feedback signal is increasing (positive result from the comparator 20) and the feedback signal (12) is overshooting the predetermined reference voltage (21)(positive normal output from the comparator 22). Otherwise the output of the AND gate 26 will be zero.

Now, considering the two situations where it is desirable to inhibit the change in feedback signal by the regulator 30.

In the first situation, where the regulated voltage output is undershooting the required voltage (the reference voltage) and where the regulated voltage output is increasing, it follows that were the regulator feedback signal held constant, the regulated voltage would rise to its desired level. In this case the comparator 22 detects the undershoot and forces the AND gate 26 to have a zero output, whilst the comparator 18 detects the increasing regulated voltage and forces the AND gate 24 to have a zero output. Therefore the NOR gate 28 has a positive output, inhibiting the regulator 30.

In the second situation, where the regulated voltage output is overshooting the required voltage (the reference voltage) and where the regulated voltage output is decreasing, it follows that were the regulator feedback signal held constant, the regulated voltage would fall to its desired level. In this case the comparator 22 detects the overshoot and forces the AND gate 24 to have a zero output, whilst the comparator 20 detects the decreasing regulated voltage and forces the AND gate 26 to have a zero output. Therefore the NOR gate 28 has a positive output, inhibiting the regulator

30.

In any other case, either or both of the AND gates 24 and 26 will have a positive output and so the NOR gate 28 will have a zero output, not inhibiting the regulator 30.

In this way, the circuit 10 inhibits the voltage regulator 30 only under conditions which will, without further iteration from the voltage regulator 30, result in the desired output voltage $V_0$ being achieved.

The voltage regulator 30 will remain disabled until the above conditions of the circuit then change, resulting in a zero output from the NOR gate 28 to the output terminal 14 which re-enables the voltage regulator 30.

FIG. 4 clearly shows the resulting advantage of the circuit 10. In a similar way to FIG. 3 a voltage drop occurs at the time $t_1$ and successive normal iterations take place at $t_2$ and $t_3$ resulting in the voltage characteristics $V_2$ and $V_3$ respectively. However it can be seen that the voltage characteristic $V_3$, if maintained will result in the return of the voltage to substantially the desired level $V_0$. The circuit also "sees" this feature, by virtue of the output from the second comparator 18 indicating (with a zero output to the AND gate 24) that the feedback voltage is increasing and the third comparator 22 indicating (with a zero normal output to the AND gate 26) that undershoot is taking place.

This satisfies the conditions for the AND gates 24 and 26 to have zero outputs which result in the NOR gate 28 having a positive output, disabling the voltage regulator circuit 30 through the output terminal 14. Accordingly at time $t_4$ and $t_5$ the voltage regulator is disabled and no reiteration of the feedback signal takes place. Overshoot is thereby avoided and the desired voltage of $V_0$ is expediently achieved.

It will be appreciated by a person skilled in the art that alternate embodiments to the one described above may be achieved. For example, a feedback arrangement for an alternative physical or electrical parameter (e.g. temperature or current) rather than a voltage output could be coupled to the circuit via a transducing arrangement. Additionally, a continuously varying feedback arrangement could be used in conjunction with the feedback circuit 10, rather than the sampled arrangement described above.

Furthermore, an alternative method to the one described above could be used for predicting overshoot and undershoot. For example, the control signal could be sampled and compared with previous values of the same, thus indicating the future tendency of the output.

Also, a sample and hold register could be used in place of the integrating arrangement 15, 16 to store previous values of the feedback signal, and alternative logic elements could be combined to produce the same characteristics as the two AND gates 24, 26 and the NOR gate 28.

Finally, the choice of the resistors 17*a*, 17*b* and 19*a*, 19*b* in the potential divider circuits may be altered to vary the acceptable margin of the desired output value from the 99% mentioned above.

We claim:

1. A feedback arrangement, comprising;

a voltage regulator having an output providing a regulation control signal;

a variable voltage source operating in response to the regulation control signal for providing a variable voltage to an output terminal of the feedback arrangement;

a feedback path coupled between the output terminal of the feedback arrangement and the voltage regulator for providing a feedback signal to the voltage regulator; and a feedback circuit including, (a) an input terminal coupled for receiving the feedback signal from the feedback arrangement, (b) an output terminal coupled to the voltage regulator of the feedback arrangement, (c) sampling means coupled to the input terminal of the feedback circuit for providing a delayed feedback signal, and (d) disabling means coupled to receive a predetermined reference signal and further coupled to the output terminal of the feedback circuit for comparing the feedback signal with the delayed feedback signal and with the predetermined reference signal and for disabling the regulating means if a predetermined relationship exists between the compared signals.

2. The feedback arrangement of claim 1 wherein the disabling means further comprises first and second comparative means; the first comparative means for comparing the feedback signal with the delayed feedback signal and for providing a first control signal; and, the second comparative means for comparing the feedback signal with the predetermined reference signal and for providing a second control signal.

3. The feedback arrangement of claim 2 wherein the disabling means further comprises a logic means coupled to receive the first and second control signals for determining whether the predetermined relationship exists between the compared signals.

4. The feedback arrangement of claim 3 wherein the logic means is arranged to disable further regulation of the feedback arrangement via the output terminal of the feedback circuit if the first and second control signals indicate that the predetermined relationship exists.

5. The feedback arrangement of claim 4 wherein the predetermined relationship is that an instantaneous trend of the feedback signal will cause the feedback signal to substantially equal the predetermined reference signal.

* * * * *